United States Patent [19]
Gilbert

[11] Patent Number: 5,589,791
[45] Date of Patent: Dec. 31, 1996

[54] VARIABLE GAIN MIXER HAVING IMPROVED LINEARITY AND LOWER SWITCHING NOISE

[75] Inventor: Barrie Gilbert, Portland, Oreg.

[73] Assignee: Analog Devices, Inc., Norwood, Mass.

[21] Appl. No.: 489,129

[22] Filed: Jun. 9, 1995

[51] Int. Cl.$^6$ .................................................. G06G 7/16
[52] U.S. Cl. ........................ 327/359; 327/356; 330/254
[58] Field of Search .................................. 327/358, 356, 327/355, 357, 359, 105, 113; 455/326, 327, 330, 333; 330/254

[56] References Cited

U.S. PATENT DOCUMENTS

| | | | |
|---|---|---|---|
| 3,736,520 | 5/1973 | Acker | 330/145 X |
| 3,970,774 | 7/1976 | Bazin et al. | 178/6 |
| 4,076,959 | 2/1978 | Gilbert et al. | 330/254 X |
| 4,156,283 | 5/1979 | Gilbert | 364/841 |
| 4,292,596 | 9/1981 | Ishizuka et al. | 330/254 X |
| 4,454,433 | 6/1984 | Welland | 327/352 |
| 4,572,975 | 2/1986 | Bowers | 327/359 |
| 4,621,238 | 11/1986 | Fenk | 330/254 |
| 4,764,892 | 8/1988 | Thomas | 364/841 |
| 4,990,803 | 2/1991 | Gilbert | 327/351 |
| 5,057,716 | 10/1991 | Küng | 327/358 |
| 5,442,311 | 8/1995 | Trafton | 327/346 X |

OTHER PUBLICATIONS

"Analog IC design: the current-mode approach," by Barrie Gilbert, Chapter 2, pp. 11–39 and 52–91.
"Analog IC design: the current-mode approach," Barrie Gilbert, Chapter 6, pp. 239–296.

*Primary Examiner*—Timothy P. Callahan
*Assistant Examiner*—Kenneth B. Wells
*Attorney, Agent, or Firm*—Marger, Johnson, et al.

[57] ABSTRACT

A mixer section is combined with a post-mixer linearizer to counteract the nonlinear transconductance characteristics of the RF input section of the mixer thereby increasing the overall linear response of the mixer. The post-mixer linearizer has a response that is increasingly non-linear outside the non-linear operating range of the RF input section. This non-linear response compensates for the decreasingly non-linear response of the RF input section. Current mirrors in the post-mixer linearizer increase the rail-to-rail headroom of the mixer while maintaining high gain. An input driver is coupled to the mixer that provides quick switching transitions in the mixer to reduce noise effects. The mixer also includes a gain control circuit that provides linear-in-decibel gain control.

36 Claims, 6 Drawing Sheets

VARIABLE GAIN MIXER HAVING IMPROVED LINEARITY AND LOWER SWITCHING NOISE

BACKGROUND OF THE INVENTION

This invention relates generally to analog receiver circuits and more particularly to a radio frequency variable gain mixer.

An example of a classic active mixer is shown in FIG. 1. The mixer 10 is comprised of a mixer core 13, which includes transistors Q1–Q4, and an RF input section 15. The mixer 10 is commonly known as the "Gilbert Mixer" after the inventor of the present application. In fact, a prior art search at the time of the invention thereof produced a reference, U.S. Pat. No. 3,241,078 issued to Jones, which showed essentially the same circuit, although it was described as a "synchronous detector," and did not seem to envision its utility in mixer applications.

The operation of the mixer 10 is as follows. In the absence of any voltage difference between the base of Q5 and Q6, the collector currents of these two transistors are essentially equal. Thus, a voltage applied to the LO port 12 results in no change of output current. Should a small DC offset voltage be present at the RF port (e.g., due to a mismatch in the emitter areas of Q5 and Q6), this will only result in a small feed through of the LO signal $V_{LO}$ to the IF output port, which will be blocked by a first IF filter (not shown). Conversely, if an RF signal $V_{RF}$ is applied to the RF port 14, but no voltage difference is applied to the LO port 12, the output currents will again be balanced. A small offset voltage (due now to emitter mismatch in Q1–Q4) may cause some RF signal feed through to the IF port; as before, this will be rejected by the IF filter. Thus it is only then when a signal supplied to both the LO port 12 and the RF port 14 that a signal appears at the IF port 16.

FIG. 2 is a graph showing the relationship between the RF input voltage ($V_{RF}$) and output voltage ($V_{IF}$) for the mixer 10, where the LO signal $V_{LO}$ is held at a DC value. As is known in the art, the relationship between $V_{RF}$ and $V_{IF}$ can be described by the hyperbolic tangent (tanh) function. As can be seen in FIG. 2, there is essentially a linear relationship between the input and output signals for a certain small operating range, generally between points 22 and 23. This is due to the linear transconductance ($g_m$) of the RF input section over that operating range. The $g_m$ of transistors Q5 and Q6, however, becomes increasingly nonlinear outside this small operating range causing the slope of the response to decline past points 22 and 23. The nonlinear operating characteristics of $g_m$ effectively compresses the input signal, inducing unwanted inter-modulation products in the mixer output signal. Emitter degeneration resistors in the emitters of Q5 and Q6 can be used to improve the linearity but this degrades the noise performance of the mixer.

Another problem with the mixer shown in FIG. 1 is the switching noise generated by the core transistors (e.g., Q1–Q4) as they switch between their "on" and "off" states. This switching noise compromises the spectral integrity of the mixer output. Referring to FIG. 3, an upper graph 26 shows a local oscillator ($V_{LO}$) signal fed into the differential pair shown in FIG. 2. A lower graph 27 shows noise bursts 28 created by the amplifier during transition periods when the $V_{LO}$ signal changes between high and low states. To reduce noise bursts 28, the mixer core transistors need to be turned on more quickly to supply more charge to their base terminals. However, more current is then required to remove the charge from the base of Q1, which makes this approach difficult to implement for high frequency applications. Accordingly, needs remain for a low noise mixer circuit with improved linearity and for providing the base charge more rapidly to and from the LO port.

SUMMARY OF THE INVENTION

A mixer is combined with a post-mixer linearizer to compensate for the nonlinear response of the RF input stage of the mixer. The post-mixer linearizer has an essentially linear operating range, but, in addition, has an output response that increases to the same extent as the incremental gain of the RF input section response decreases outside this linear operating range. This increasing response counteracts the decreasing nonlinear response of the RF input section so that the combination of the mixer and post-mixer linearizer increases the overall linear operating range of the combined mixer circuit.

The post-mixer linearizer includes first and second output branches that operate in a complementary manner to create the necessary response for counteracting the nonlinearity in the mixer core. The output branches provide high current gain with increased rail-to-rail voltage headroom.

In another aspect of the invention, an input driver is coupled to the mixer section, which supplies electrical charge quickly into and out of the mixer core. The input driver includes Class AB emitter followers and an associated bias stage for quickly supplying and removing charge from each of the LO inputs of the mixer core. The forced supply and withdrawal of charge from each input terminal provides rapid transitions between on and off states in the mixer core. Thus, noise created during mixer switching transitions is reduced.

In yet another aspect of the invention, the mixer core includes a gain control circuit that varies the mixer gain exponentially in relation to linear changes in a gain control signal. Thus, the mixer provides linear in decibel gain control.

The foregoing and other objects, features and advantages of the invention will become more readily apparent from the following detailed description of a preferred embodiment of the invention which proceeds with reference to the accompanying drawings.

DETAILED DESCRIPTION

Overview

Figure 4:
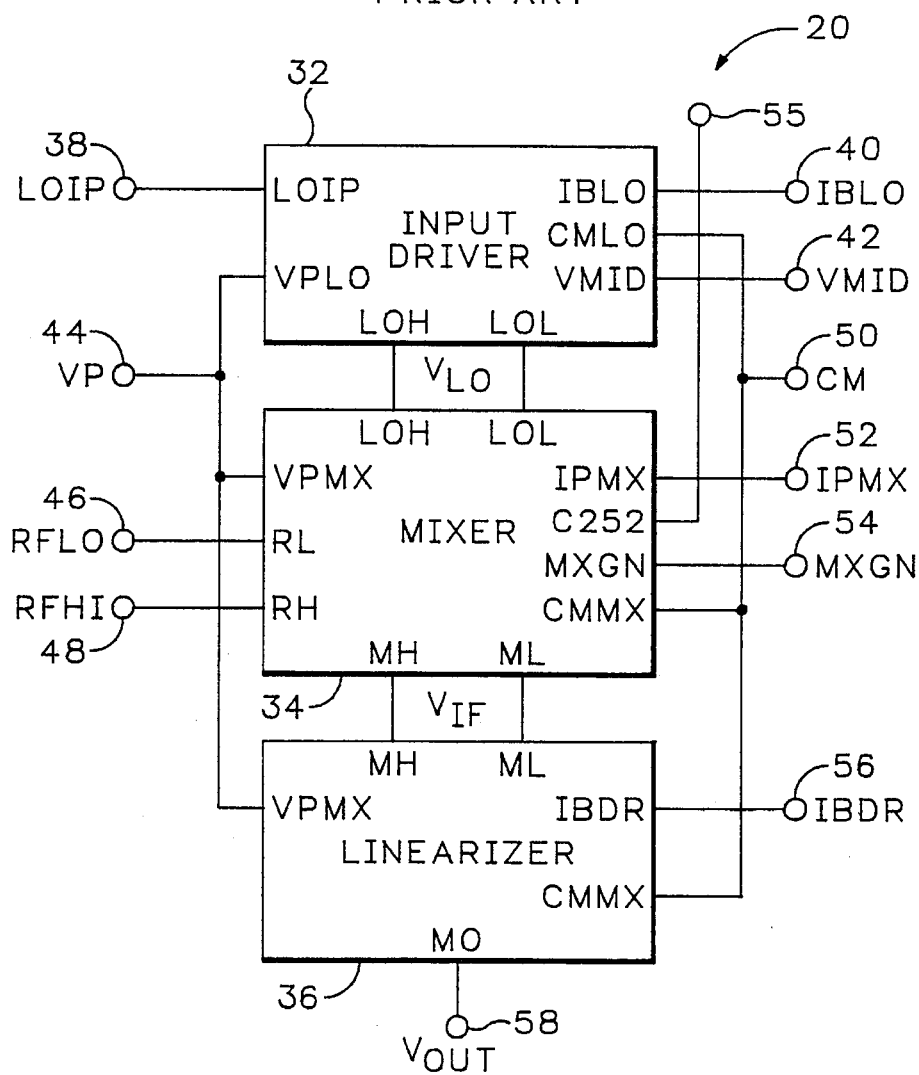
FIG. 4 is a block diagram of a mixer circuit according to the invention.

FIG. 4 is a block diagram of a practical embodiment of a variable gain mixer circuit 30 having increased linear response and increased noise suppression according to the invention. The mixer circuit 30 includes a local oscillator input driver 32, a mixer section 34, and a post-mixer linearizer 36, the latter two being connected in series. The input driver 32 improves the noise performance of the mixer 34. The mixer section 36, in addition to embodying a transconductance stage, includes a linear-in-dB gain control circuit that varies the gain of the mixer exponentially in response to linear changes in a gain control current ($I_G$) applied to terminal 54. Finally, the post-mixer linearizer 36 compensates for the non-linear response of the mixer as described below.

The LO input driver 32 receives a single-sided input signal LOIP at terminal 38 and produces a well-balanced differential output signal $V_{LO}$, which is provided to the mixer section 34. The input driver is balanced about a mid-point reference voltage VMID supplied at terminal 42. A bias current IBLO is received at terminal 40 for energizing the LO driver 32.

The mixer section 34 receives a differential radio frequency (RF) input signal (RFLO and RFHI) at terminals 46 and 48. A reference current IPMX is supplied at terminal 52 and a gain control current MXGN, which sets the gain of the mixer, is supplied to terminal 54. The mixer section 34 generates a differential intermediate frequency $V_{IF}$ signal across terminals MH and ML, which is fed into the post-mixer linearizer 36.

The post-mixer linearizer 36 receives an enable signal IBDR at terminal 56 and produces an intermediate frequency (IF) output signal $V_{OUT}$ at terminal 58. Supply voltages VP and CM provided to terminals 44 and 50, respectively, are fed into each block. In the preferred embodiment, the mixer circuit 30 is implemented in complementary bipolar technology. However, other technologies such as CMOS can be used with appropriate modification as will be apparent to those skilled in the art based on the following description.

Input Driver

Figure 5:
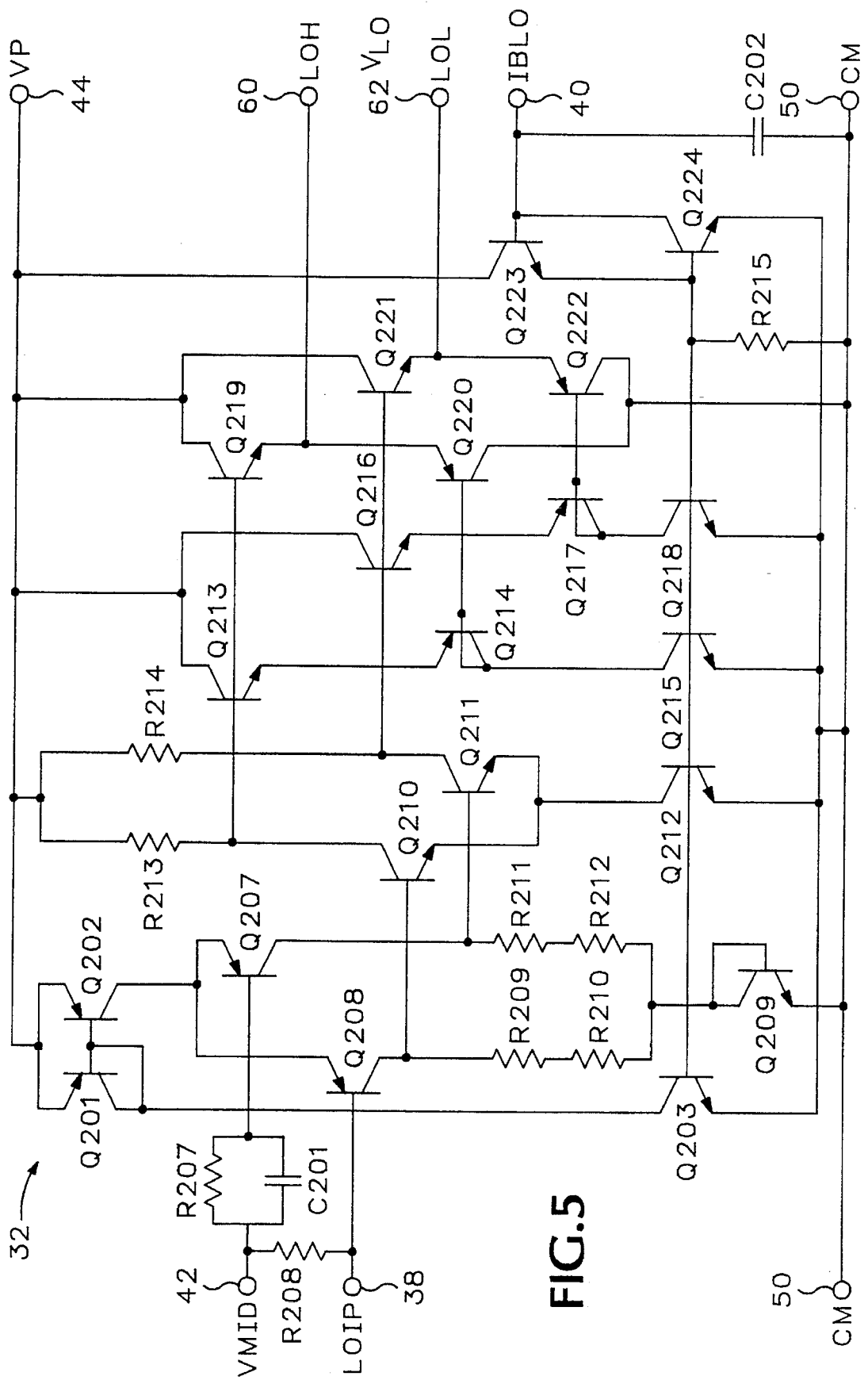
FIG. 5 is a detailed circuit diagram of an input driver for the mixer circuit shown in FIG. 4.

Referring now to FIG. 5, a detailed circuit diagram of the input driver 32 is shown. To reduce noise created during switching transitions and to increase signal gain, LO input driver 32 is used to drive the mixer section 34. The mixer section is shown in detail in FIG. 6, described further below.

The input driver 32 raises the voltage level of the single-sided input voltage LOIP at terminal 38 to a level required by the mixer section. The LO input signal LOIP is a single-sided voltage of typically ±50 millivolts (mV) (−16 dBm) at 229 megahertz (MHz). The LO signal to the mixer core 34 (FIG. 6), on the other hand, is at about ±250 mV and in well-balanced differential form. The input driver 32 provides enough high-frequency gain so that the input driver 32 behaves like a limiter, generating an essentially square-wave drive signal to the mixer core 42. This results in maximum conversion efficiency and minimum noise.

Resistor R208 is coupled between terminals 42 and 38 and provides an internal bias return path for the LOIP input signal. Resistor R207 and capacitor C201 are coupled in parallel to node 42. R207 co-balances the bias offset created by R208 and capacitor C201 shunts R207 at high frequencies.

Transistors Q207 and Q208 are coupled together as a first differential pair and are typically biased to 100 micro amps (µA), which is proportional-to-absolute-temperature (PTAT) in the preferred embodiment. The biased first differential pair forms a first amplifier stage. The first amplifier stage includes load resistors R209–212 and a diode-connected transistor Q209 coupled in series therewith. The first amplifier stage is biased by a current mirror comprised of transistors Q201 and Q202.

The first amplifier stage has an unloaded voltage gain of 9.75, which is lowered to 8.65 by the input resistance of a second differential pair Q210–211 at nominal NPN betas (β). The second amplifier stage is biased by current source transistor Q212 to about 100 µA (PTAT) and loaded by two 2KΩ load resistors R213 and R214 coupled to the collectors of Q210 and Q211, respectively. The second amplifier stage supplies a loaded low frequency gain of approximately 30.3.

The right-hand half of the input driver 32 comprises a first Class-AB emitter-follower (Q219/Q220) and a second Class-AB emitter-follower (Q221/Q222). Transistors Q219 and Q220 comprise a first complementary transistor pair (first output stage) coupled between the collector of Q210 and terminal 60. Transistors Q221 and Q222 comprise a second complementary transistor pair (second output stage) coupled between the collector of Q211 and terminal 62.

Two bias stages are interposed between the amplifier stages and the two output stages. The first bias stage includes emitter follower circuit Q213/Q214, which controls the first output stage and the second bias stage includes emitter follower circuit Q216/Q217, which controls the second output stage.

Figure 6:
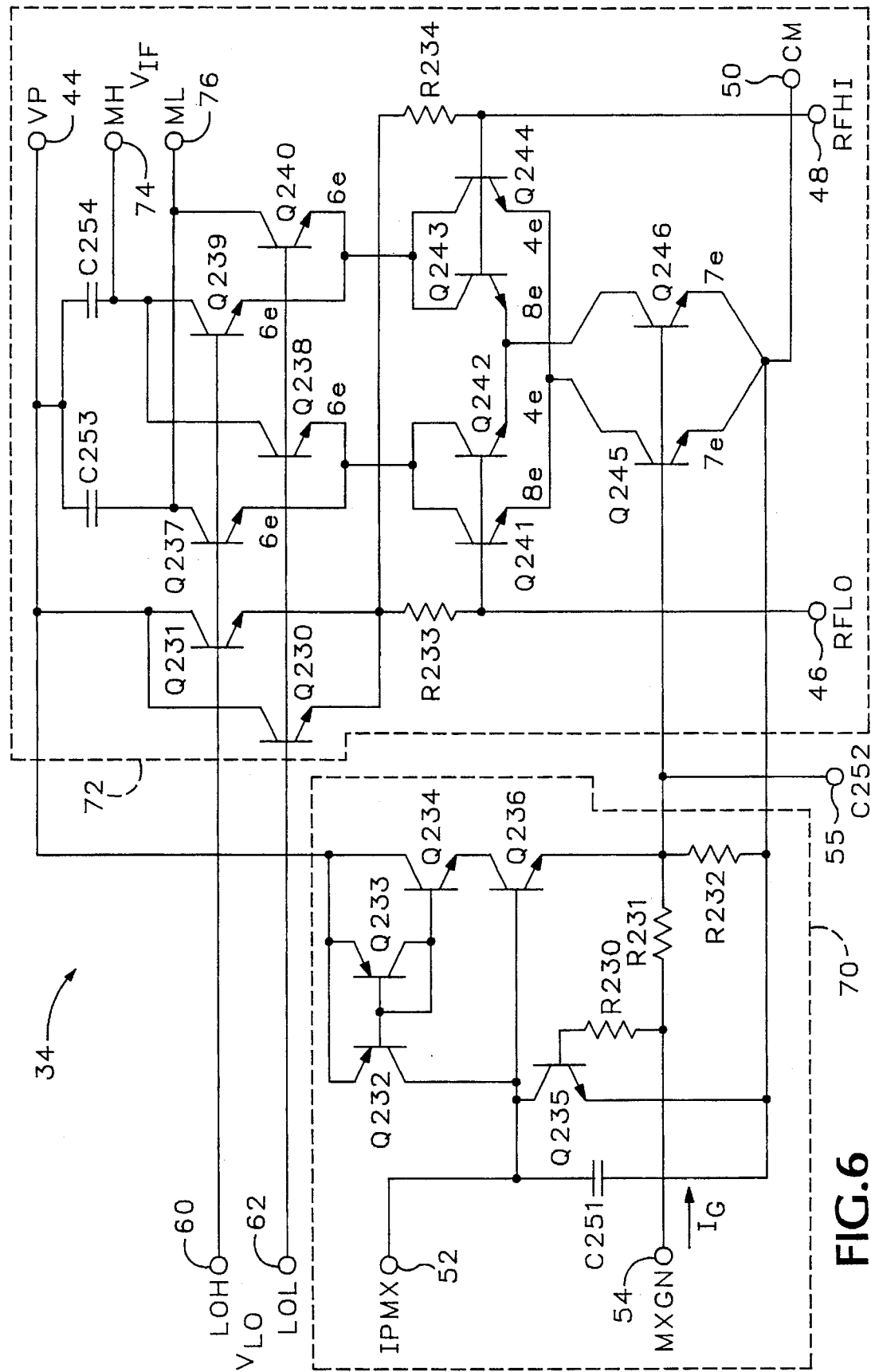
FIG. 6 is a detailed circuit diagram of a mixer section for the mixer circuit shown in FIG. 4.

The output stages are biased to moderate currents, but the transistors Q219–222 carry high peak currents of about 400 µA at a typical LO frequency of 229 MHz due to the base-current loading of the mixer's core (FIG. 6). The loaded low frequency voltage gain from terminal 38 to the output terminals 60 and 62 is approximately 29.3.

The LO input driver 32 is energized by a 50 µA (PTAT) input current IBLO at terminal 40. Current IBLO drives conventional current mirror transistor Q224, whose current is mirrored by Q203, Q212, Q215, and Q218. The current mirror transistor Q224 is aided by an emitter-follower Q223, which operates at 79 µA that establishes an $r_e$ in Q223 of approximately 330Ω thus providing decoupling on the common bias node at the emitter of Q223. Capacitor C202 ensures that the beta-loop around Q223 and Q224 is stable, and also maintains a low impedance at high frequency.

In operation, the output stages Q219/Q220 and Q221/Q222 and associated bias stages supply and draw charge quickly to and from the core transistors in the mixer section 34. For example, when the base of transistor Q221 goes positive, Q216 couples this voltage change through diode Q217 to the base of transistor Q222 and a charge is supplied to terminal 62. However, when the base of Q221 goes negative, Q216 couples this negative voltage step to Q222, turning it on. Transistor Q222 then quickly pulls the output terminal 62 negative and the charge at the input terminal of the mixer core is removed. Thus, the input driver 32 provides a large charge for quick turn on and off of the mixer core. In this way, noise created during mixer core on-off transitions is reduced.

Mixer Section

Figure 1:
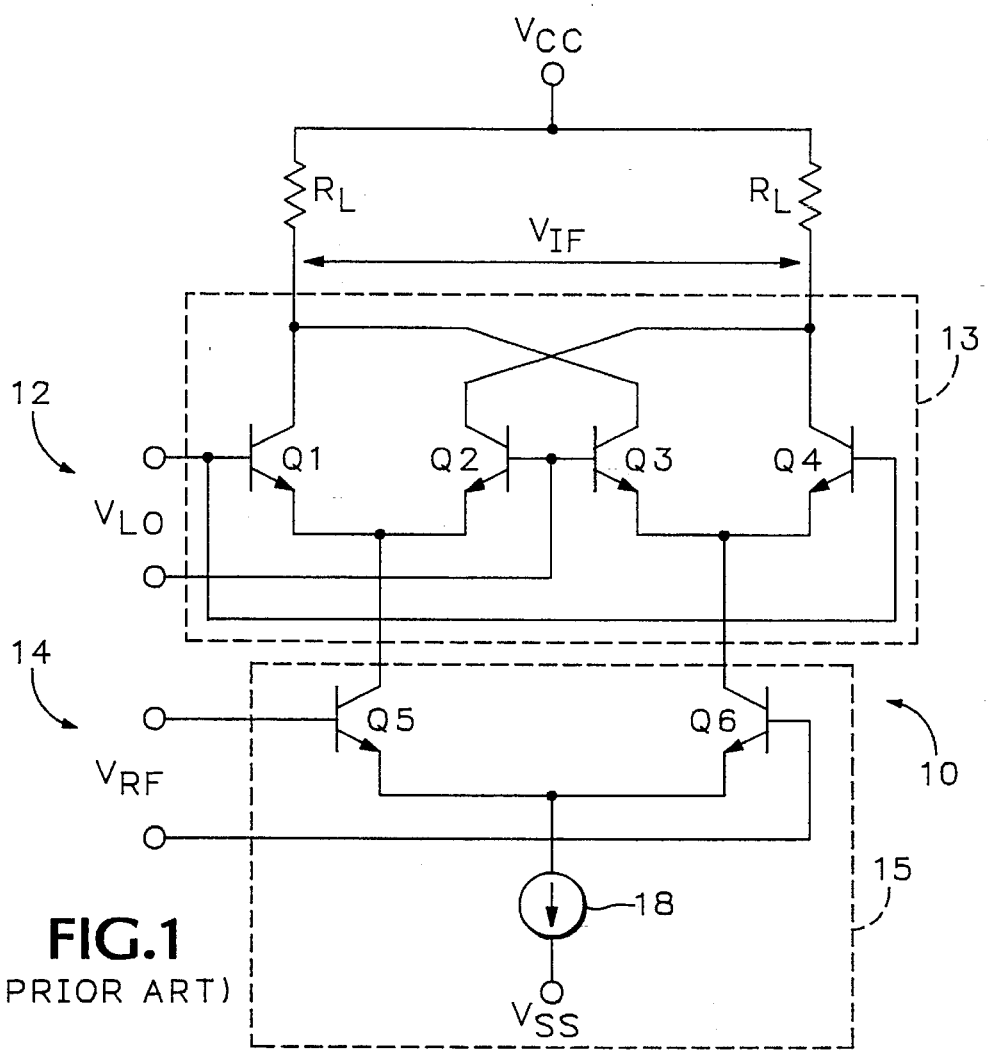
FIG. 1 is a prior art mixer circuit.

FIG. 6 is a detailed circuit diagram of the mixer section 34 previously shown in FIG. 4. The mixer section includes a mixer core comprised of transistors Q237–240 arranged as a conventional doubly-balanced switching modulator, as shown in FIG. 1. Instead of the prior art RF input stage, the mixer section 34 includes a so-called "multi-tanh doublet," which operates as a conventional transconductance ($g_m$) stage but which exhibits improved linearity. The multi-tanh doublet is described in my commonly-assigned, co-pending application entitled "LOW-SUPPLY VOLTAGE MIXER HAVING OVERLAPPING INPUT SIGNAL RANGES," Ser. No. 08/344,375, filed Nov. 23, 1994, incorporated herein by reference. The use of the doublet, however, is not essential to the operation of the invention. Nor are the particular emitter area ratios described here necessary. Accordingly, for purposes of the following discussion the multi-tanh doublet can be considered a $g_m$ stage, having improved but not perfect linearity.

Typically, an RF input signal is applied in single-sided form to one of the input terminals 46 or 48, usually by a blocking capacitor (not shown). DC bias paths for the RFLO and RFHI inputs are provided by R233 and R234, whose common node is biased by Q230 and Q231. This arrangement ensures that all parts of the mixer core operate correctly at the minimum supply of 2.7 V and temperature of −25 degrees Centigrade.

The input impedance seen from RFHI to RFLO varies slightly with the gain-control voltage MXGN at terminal 54. This is due to the variation in bias current in Q245 and Q246 and thus, in the "multi-tanh doublet" formed by differential pairs Q241/244 and Q242/243. For nominal parameters and operating conditions, the resistive part of the impedance varies almost linearly from 2.7kΩ at $I_G$=0 (maximum gain, hence maximum bias current) to 5.5kΩ at $I_G$=75 µA. The effective input capacitance of the mixer itself, excluding pad and pin parasitics, varies from 1.5 pF at $V_G$=0 to 1.15 pF at $I_G$=75 µA. Adding a further 1.25 pF for parasitic capacitances, the total input capacitance will vary from between 2.4 pF and 2.75 pF. The input impedance $Z_{IN}$ at 240 MHz varies essentially linearly from 238Ω at the practical maximum gain to 272Ω at the practical minimum gain.

HF loading at each side of the differential output at nodes MH and ML is provided by the capacitors C253 and C254. The post-mixer linearizer 36 (FIG. 4) has a moderately high impedance. Thus, the capacitors C253 and C254 form a low-pass corner with a 3 dB frequency close to 100 MHz. The low-pass corner attenuates the sum frequency component of the output signal, typically of 240 MHZ+229.3 MHz=469.3 MHz, while the intermediate frequency (IF) present between terminals 74 and 76 is passed with little attenuation.

Mixer Gain Control Circuit

The mixer section 34 also includes a gain control circuit 70, which controls the gain of the mixer. The gain control circuit provides "linear-in-decibel" gain control since a linear increase in a gain control current produces a corresponding exponential increase in the gain of the mixer, hence "linear-in-decibel." This is accomplished by varying a bias current supplied to the mixer core 42. Before considering how this is accomplished, the "basic" biasing for the RF input stage in mixer core 42 is discussed first.

A mixer bias current IPMX of approximately 109 µA is applied at terminal 52 and flows in Q235 with the aid of emitter-follower Q236. Transistor Q236 is biased to about 180 µA, when $I_G$=0, which flows through R232. For a gain-control current $I_G$ applied to terminal 54 equal to zero and for very large beta values, transistors Q245 & Q246 operate at a multiple of the input current at node IPMX. The input current ratio is defined by the emitter-area ratios between Q245,Q246 and Q235, which in the preferred embodiment is 7. Thus, the nominal collector current of Q245 and Q246 is 7*109 µA or approximately 763 µA.

There is some small current at the base of Q235 (about 2 µA) even when the $I_G$ is zero. Thus, the peak current at Q245 and Q246 is higher due to the voltage drop across R231. For finite NPN betas, the current in Q245 and Q246 is raised by the voltage drop across both R231 and R230.

For the general case where $I_G$ is non-zero at terminal 54, the current $I_G$ causes a reduction of $\Delta V_{BE} = I_G * R231$ between the $V_{BE}$ of Q235 and that of Q245, Q246. The currents of transistors Q245 and Q246 are, therefore, reduced by the ratio $\exp(\Delta V_{BE}/V_T)$, where $V_T$ is the thermal voltage kT/q. Thus, a linear increase in $I_G$ causes an exponential reduction in the transconductance $g_m$ at the input stage of the mixer core 42, i.e., a logarithmic gain reduction is produced.

The scaling is chosen such that a 1 µA (PTAT) change in $I_G$ causes $\Delta V_{BE}$ of 1 mV (PTAT) and consequently a change of exp(1/26), or about 0.333 dB in the mixer's gain. Thus, the 75 µA (PTAT) full-scale change in $I_G$ (2 µA to 77 µA) results in a gain change of 75*0.333 dB, or 25 dB. It will be apparent to those skilled in the art that the gain control circuit can be made responsive to a voltage rather than a current with the addition of an appropriate current-to-voltage converter (not shown).

The 75 µA (PTAT) current variation at node MXGN is absorbed by Q236. The variation in the emitter current of Q236 is actually slightly less because the $V_{BE}$ of Q245 and Q246, and hence the current in R232, reduces with $I_G$. A nominal beta of 110 results in a base-current variation of about 0.7 µA in Q236. The variation in the base current in Q236 varies the primary current supplied to the collector of Q235 causing a small gain nonlinearity. The change in primary current to Q235 is especially problematic for very low betas. For example, at one-third the nominal beta a base current change of 2 µA would represent a roughly 2%, or 0.17 dB, nonlinearity.

Transistors Q232–Q234 corrects for variations in the collector current in Q235. Transistor Q234 has a base current closely replicating that of Q236. Current mirror Q232,Q233 is coupled between the base of Q234 and the input terminal 52 and offsets changes in the base current in Q236. Thus, the overall change in primary current in the collector current of Q235 over the full range of $I_G$ and betas (β) is very small.

A large capacitor (not shown) is coupled to terminal 55 to hold the impedance at the bases of the current-source transistors Q245/246 to as low a value as possible minimizing HF modulation noise. Capacitor C251 is coupled across Q235 to ensure that the 'beta-loop' around Q235/236 is stable. Capacitor C251 also serves to maintain a low HF impedance at terminal 52.

Application of the linear-in-dB gain control circuit is not limited to mixer applications but can be used in any amplifier that employs a transconductance stage whose gain is linear to the bias current supplied thereto. An example of another application can be found in my commonly-assigned, co-pending application entitled "LINEAR-IN-DECIBEL VARIABLE GAIN AMPLIFIER," Ser. No. 08/472,901 filed Jun. 9, 1995.

Post-Mixer Linearizer

Figure 7:
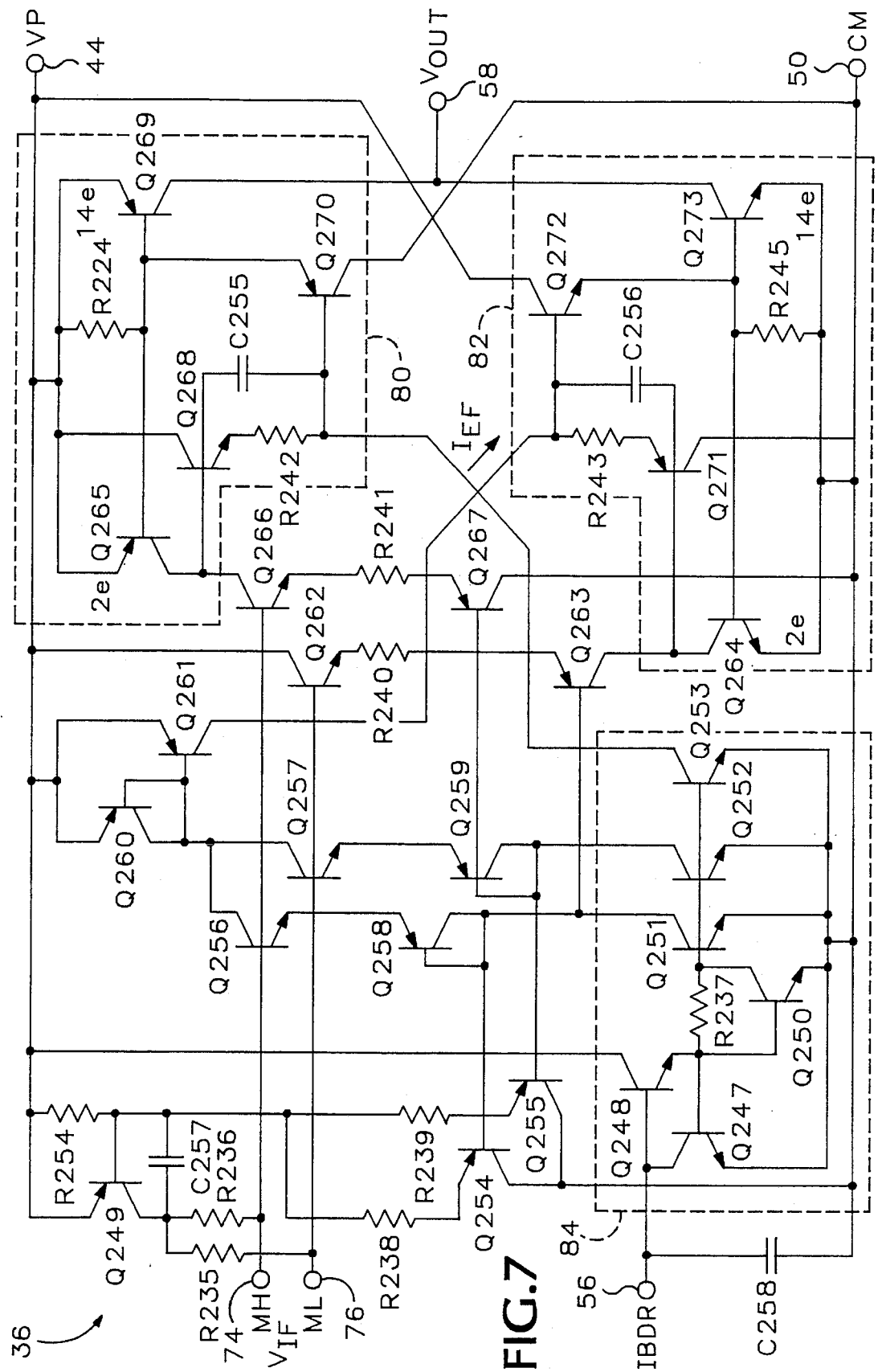
FIG. 7 is a detailed circuit diagram of a post-mixer linearizer for the mixer circuit shown in FIG. 4.

FIG. 7 is a detailed circuit diagram of the post-mixer linearizer 36 shown in FIG. 4. The purpose of the post-mixer linearizer, as the name implies, is to correct or compensate for the non-linear response of the RF input section of the mixer. This would be particularly important where the RF input section is a single transconductance stage instead of the multi-tanh doublet as shown and described above. Even with the multi-tanh doublet, however, some non-linearity remains. The post-mixer linearizer compensates for this remaining non-linearity.

The IF output signals MH and ML at terminals 74 and 76 from the mixer section 72 (FIG. 6) are at a fairly low level, at a moderately high impedance, differential in form and close to the positive supply voltage. The post-mixer linearizer 36 also provides a large amount of post-mixer gain to drive a doubly-terminated 330Ω filter (not shown). The output at terminal 58 is a current; with the addition of a load impedance, the post-mixer linearizer 36 centers the IF output ($V_{OUT}$) to the mid-point of the supply voltage and provides further pre-filtering of frequency sum components at the mixer core output.

Simple resistive loads R235 and R236 are coupled at the mixer core output at terminals 74 and 76 allowing introduction of a low-pass pole of known and fixed frequency. Using the largest possible values for load resistors R235 and R236 results in low noise by providing the maximum possible voltage gain in the first stage of a high gain amplifier system. In one embodiment, R235 and R236 are each approximately 458.5 ohms.

Resistive loads R235 and R238 alone would result in a proportional to absolute temperature (PTAT) voltage swing of 328 mVP, which would be acceptable if the loads could be taken directly to the reference voltage VP. However, the DC voltage level of the IF signal at the input of the post-mixer linearizer 36 must be about a $V_{BE}$ below the bias voltage VP, to satisfy certain bias constraints in the mixer core 32. If a 328 mV variation is superimposed on a $V_{BE}$ drop, the collectors in the mixer core fall by a maximum of about 1 V below VP. The transistors in the mixer core 72 would then saturate.

The saturation problem is avoided by using a common-mode bias circuit which overcomes the disadvantages of other active loading schemes. The MH and ML inputs of the post-mixer linearizer are coupled to emitter followers Q256/Q258 and Q257/Q259. The emitter followers are biased to 65 µA (PTAT) by Q251 and Q252. The voltages at the emitters of diodes Q258 and Q259 are sensed by the PNP emitter followers Q254 and Q255, and averaged in R238 and R239, in conjunction with C257. The resulting common mode voltage is applied to the base of Q249 which servos the voltage at the bottom of load resistors R235 and R236 at terminals 74 and 76. Thus, the voltages MH and ML vary only slightly with the mixer core bias currents.

The voltage variation is still 240 mV over the full gain and temperature range. This is approximately 100 mV less variation and, more importantly, the PTAT variation in the bias voltage in the mixer core 42 is eliminated and "replaced" by complementary to absolute temperature variations (CTAT). Overall, the improvement over temperature compared to simple resistive loading is significant.

Transconductance Correction

A main feature of the post-mixer linearizer 36 is that it is really a $g_m$ stage that provides a current output with near rail-to-rail voltage compliance. In the preferred embodiment, this $g_m$ is nominally 16.3 mS. Thus, when used with a 165Ω load, the voltage gain from the differential port (MH, ML) to the final mixer output ($V_{OUT}$) at terminal 58 is close to 2.7 times or 8.6 dB.

Transistors Q266 and Q267 are biased into conduction by the combined $V_{BE}$'s of Q256 and Q258, while Q262 and Q263 are biased into conduction by the combined $V_{BE}$'s of Q257 and Q259. When the voltage across MH and ML ($V_{IF}$) is zero, the voltage at the base of Q256 and Q257 are the same. The emitters for both Q256 and Q257 are also at the same voltage potential. Thus, the current down the R240 branch and the R241 branch are both equal and approximately 73.2 µA (PTAT). This current is larger than the bias currents in the emitter-follower branches Q256 and Q257 because of the emitter areas in Q263 and Q267 are a multiple of those in Q256 and Q257 (e.g., 2:1). However, the current is not doubled because of the inclusion of the emitter resistors R240 and R241.

A cross-over connection between the emitter followers Q256 and Q257 and the R240 and R241 output branches provide an output response that counteracts nonlinear characteristics of the $g_m$ in the mixer core 42. The differential voltage between MH and ML is transferred via the emitter-followers Q256 through Q259 to the bases of Q266 and Q267 in the R241 branch and the bases of Q262 and Q263 in the R240 branch, respectively.

If MH goes high relative to ML, the current in the R241 branch increases while current in the R240 branch decreases. The opposite occurs when MH goes low relative to ML. Thus, the fully-differential output of the mixer core 72 is converted to two separate currents. The separate currents each have a local transconductance $g_m$ controlled by the bias currents which are directly traceable to physically large 1kΩ resistors in a PTAT bias generator (not shown). The $g_m$ is also controlled by the values of R240 and R241 (~152.8Ω), which are made physically large to ensure good control. The emitter resistance $r_e$ of the output branches (i.e., R240 branch and R241 branch) at 73.2 µA (PTAT) are each 353Ω. Thus, the net $g_m$ in each output branch is 1/(353.1Ω+152.8Ω+353.1Ω), or 1.164 mS.

The R241 branch drives PNP current-mirror 80 and the R240 branch drives NPN current-mirror 82. The PNP current mirror comprises essentially Q265 and Q269, and is aided by complementary emitter followers Q268 and Q270. The NPN current mirror 82 comprises essentially Q264 and Q273 and is aided by Q271 and Q272. The current mirrors each provide a current gain of 7 by virtue of the emitter area ratios (i.e., 14:2). Each current mirror is biased into Class-AB and, therefore, both mirrors contribute to the output at moderate signal amplitudes. Thus, the effective current gain is 14. This raises the overall $g_m$ from the IF input ($V_{IF}$) at 74, 76 to the output ($V_{OUT}$) at 58 to 14*1.164 mS=16.3 mS.

Figure 10:
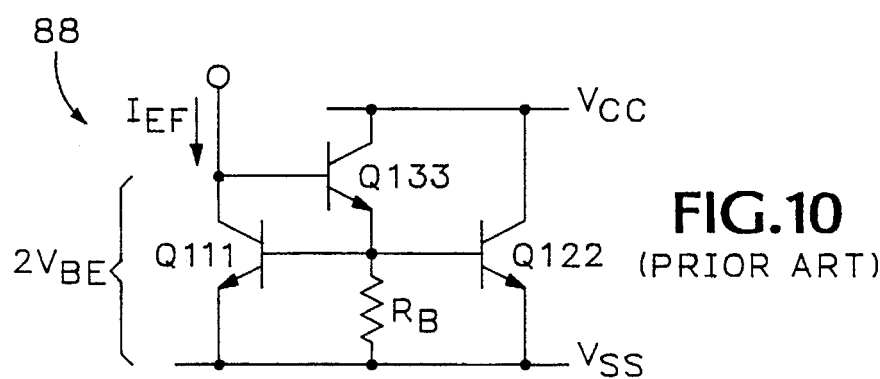
FIG. 10 is a circuit diagram of a prior art current mirror.

FIG. 10 is a circuit diagram of a prior art current mirror 88. A single emitter-follower Q133 is coupled to the base of Q122 to provide additional gain which would not be available with smaller values of beta. While Q133 increases gain it also increases the voltage drop across the current mirror input. Specifically, Q133 creates a voltage drop of two $V_{BE}$ above the supply or ground. This two-$V_{BE}$ voltage drop makes the application of this prior art current mirror undesirable for low voltage environments. For low voltage applications, it is desirable to design a current mirror having as little a voltage drop as possible while also having the benefit of the extra gain provided by Q33.

The current mirrors 80 and 82 satisfy these two objectives. Referring again to current mirror 82 in FIG. 7, a PNP transistor Q271 is included to bring the offset voltage down to one $V_{BE}$. An additional drive current $I_{EF}$ is generated by an auxiliary current mirror formed by transistors Q260 and Q261. This supply current drives Q271 and Q272 and provides extra current gain to the current mirror 82. R243 provides an additional voltage drop of ($I_{EF}$*R243), which causes the base-to-emitter voltage of Q264 to drop below $V_{BE}$. The input voltage of current mirror 82 is then equal to $V_{BE}$-($I_{EF}$* R243). A capacitor C256 is coupled between the bases of Q271 and Q272 and operates as a diode at high frequencies thereby eliminating phase error. R243 also sets a predictable time constant for capacitor C256.

A similar but complementary design is used in current mirror 80. A current supply transistor Q253 provides the additional drive current to current mirror 80, as did Q261 in current mirror 82.

Thus, the current mirrors 80 and 82 provide high current gain in the sense that a large area ratio is established between, for example, Q264 and Q273 without high sensitivity to beta tolerances. Second, the current mirror has a very low input voltage of approximately 100 millivolts. Thus, the incorporation of Q271 in combination with R243 in current mirror 82 and Q268 in current mirror 80 increase the available headroom for the current mirrors while maintaining high open-loop current gain.

Figure 2:
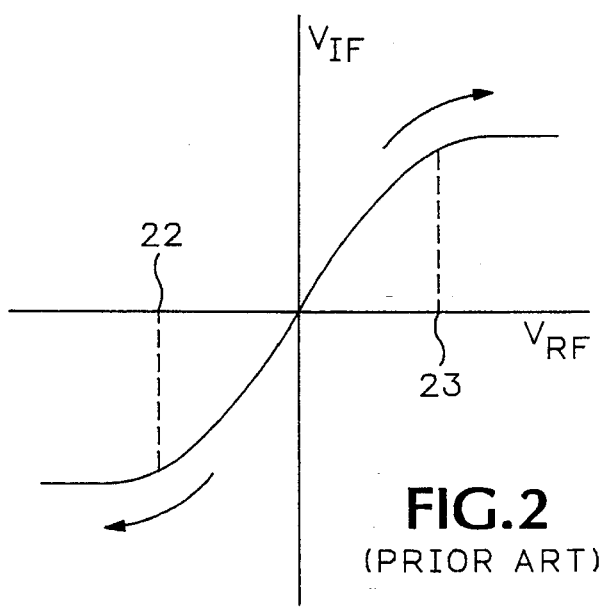
FIG. 2 is a graph showing the operating characteristics of a prior art mixer circuit.
Figure 3:
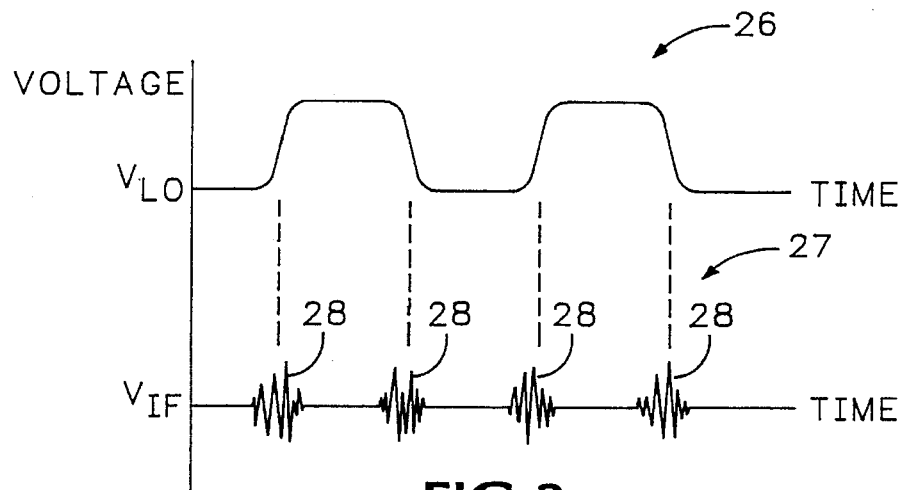
FIG. 3 is a sketch showing the switching noise created during transitions of the mixer of FIG. 1.

The transconductance of the post-mixer linearizer 36 is deliberately rendered nonlinear to compensate for nonlinearity in the $g_m$ of the mixer core. For example, assume that the RF input $g_m$ is simply that of a bipolar differential pair, having a hyperbolic tangent transfer curve. This results in a compressive nonlinearity as previously shown in FIG. 2. The incremental $g_m$ is progressively reduced as the instantaneous value of the input signal at the RF port increases.

The $g_m$ of the post-mixer linearizer 36 is designed to "increase" as the differential voltage between $V_{IF}$ increases, resulting in an expanding nonlinearity. Resistors R240 and R241 scale the nonlinear effects in the post-mixer linearizer to optimize the nonlinear compensation. Without R240 and R241, the compensation would be too severe.

Figure 8:
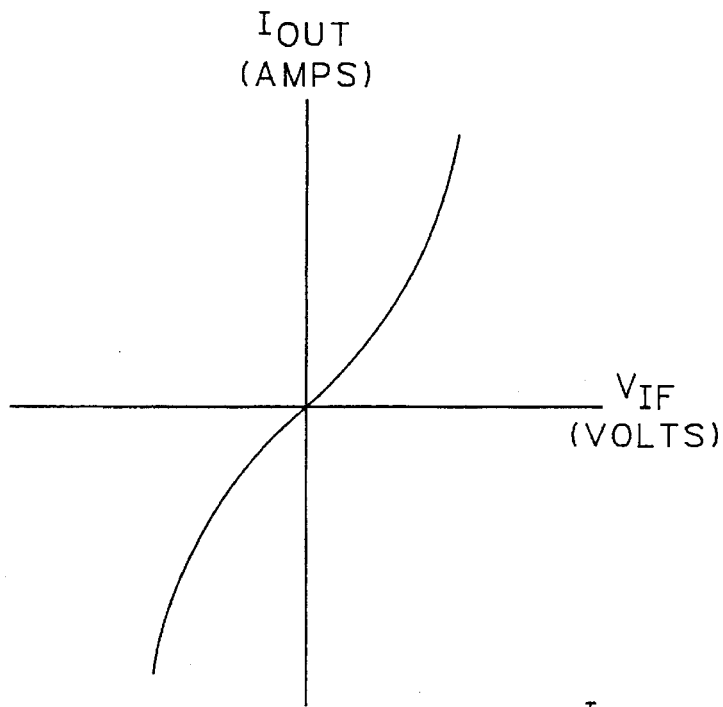
FIG. 8 is a graph showing the operating characteristics of the post-mixer linearizer shown in FIG. 7.

The $g_m$ compensation of the post-mixer linearizer 36 operates in the following manner. When the base of Q256 goes positive, due to a relative increase in the IF signal at 74, Q266 turns on. The base of PNP transistor Q267, however, is coupled to diode Q259 and, therefore, goes negative. Thus, the current in the collector of Q266 goes up, and the current in the collector of Q263 goes down. Alternately, if the differential voltage $V_{IF}$ is higher at node ML relative to MH, the current in Q267 goes down and the current in Q263 goes up. Thus, the collector current in Q263 increases and the collector current in Q266 decreases. When combined, the signals from the R240 and R241 branches generate two different halves of the output signal $V_{OUT}$ at 58. The operating response of the post-mixer linearizer 36 is shown in FIG. 8. It can be seen that the post-mixer linearizer has a substantially linear $g_m$ but begins to progressively increase at larger values of $V_{IF}$.

Figure 9:
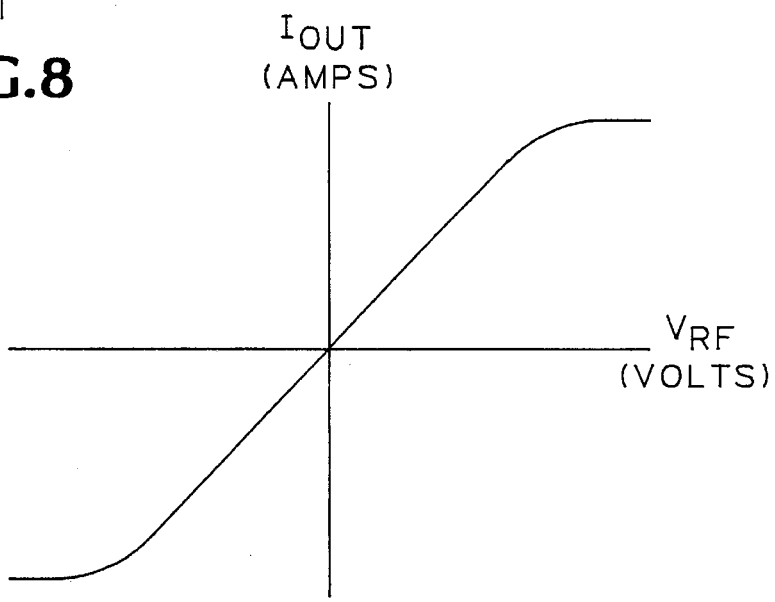
FIG. 9 is a graph showing the increased linear operating range for the mixer circuit shown in FIG. 4.

Thus, the gm response of the mixer core 72 and the post-mixer linearizer 36 actually work with each other to achieve a wider linear operating range. FIG. 9 is a graph showing the increased overall linear $g_m$ of the mixer circuit shown in FIG. 4. This wider linear response prevents the mixer core from producing cross-modulation products prior to filtering.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. A mixer circuit, comprising:

a mixer for mixing a first signal received on a first differential input and a second input signal received on a second differential input, the mixer having first and second outputs forming a differential output for providing a mixer output signal responsive to the first and second input signals, the mixer having a linear transconductance within a given operating range and a nonlinear transconductance outside the given operating range; and a post-mixer linearizer circuit having a differential input coupled to the differential output of the mixer and an output for providing a linearized mixer output signal, the post-mixer linearizer circuit including:

a first output driver having a first input coupled to the first output of the mixer, a second input, and an output coupled to the output of the post-mixer linearizer for providing a first half of the linearized mixer output signal, a second outout driver having a first input coupled to the second output of the mixer, a second input, and an output coupled to the output of the post-mixer linearizer for providing a second half of the linearized mixer output signal, a first diode having an anode coupled to the first mixer output and a cathode connected to the second input of the second output driver, wherein the first diode reduces a signal level at the second input of the second output driver responsive to an increase in a signal level at the first mixer output, a first current source connected to the cathode of the first diode, a second diode having an anode coupled to the second mixer output and a cathode connected to the second input of the first output driver, wherein the second diode reduces a signal level at the second input of the first output driver responsive to an increase in a signal level at the second mixer output, whereby the linearized mixer output signal has improved linearity over the output signal of the mixer, and a second current source connected to the cathode of the second diode.

2. A mixer circuit according to claim 1 wherein the post-mixer linearizer circuit further includes a first branch transistor having a collector coupled to a voltage supply terminal, a base coupled to the first mixer output, and an emitter coupled to the anode of the first diode, the first branch transistor producing a first current that passes through the first diode responsive to the signal on the first mixer output; and a second branch transistor having a collector coupled to the voltage supply terminal, a base coupled to the second mixer output, and an emitter coupled to the anode of the second diode, the second branch transistor producing a second current that passes through the second diode responsive to the signal on the second mixer output.

3. A mixer circuit according to claim 1 wherein the first output driver includes:

an NPN transistor having a base connected to the first mixer output, a collector coupled to the output of the post-mixer linearizer for providing the first half of the linearized mixer output signal, and an emitter; and a PNP transistor having a base connected to the cathode of the second diode, a collector coupled to a common supply terminal, and an emitter coupled to the emitter of the NPN transistor.

4. A mixer circuit according to claim 3 wherein the first output driver includes a resistor interposed between the emitter of the NPN transistor and the emitter of the PNP transistor.

5. A mixer circuit according to claim 3 wherein the first output driver includes a current mirror coupled between the collector of the NPN transistor and the output of the post-mixer linearizer.

6. A mixer circuit according to claim 5 wherein the current mirror includes:

a first PNP current mirror transistor having an emitter connected to a voltage supply terminal, a base, and a collector connected to the collector of the NPN transistor of the first output driver;

a second PNP current mirror transistor having an emitter connected to the voltage supply terminal, a base connected to the base of the first PNP current mirror transistor, and a collector connected to the output of the post-mixer linearizer;

a first current mirror resistor connected between the voltage supply terminal and the bases of the first and second PNP current mirror transistors;

a first NPN current mirror transistor having a collector connected to the voltage supply terminal, a base connected to the collector of the first PNP current mirror transistor, and an emitter;

a third PNP current mirror transistor having an emitter connected to the bases of the first and second PNP current mirror transistors, a base, and a collector connected to common supply terminal;

a second current mirror resistor connected between the emitter of the NPN current mirror transistor and the base of the third PNP current mirror transistor; and a current mirror current source coupled to the base of the third PNP transistor.

7. A mixer circuit according to claim 6 wherein the current mirror further includes a capacitor coupled between the base of the NPN current mirror transistor and the base of the third PNP current mirror transistor.

8. A mixer circuit according to claim 6 wherein the first PNP transistor includes a first emitter area (e) and the second PNP transistor includes a second emitter area (Ae) wherein the ratio of the first emitter area to the second emitter area is equal to e:Ae.

9. A mixer circuit according to claim 2 wherein the second output driver includes:

an NPN transistor having a base connected to the second mixer output, a collector coupled to the supply voltage terminal, and an emitter; and a PNP transistor having a base connected to the cathode of the first diode, a collector coupled to the output of the post-mixer linearizer for providing the second half of the linearized mixer output signal, and an emitter coupled to the emitter of the NPN transistor.

10. A mixer circuit according to claim 9 wherein the second output driver includes a resistor interposed between the emitter of the NPN transistor and the emitter of the PNP transistor.

11. A mixer circuit according to claim 9 wherein the second output driver includes a current mirror coupled between the collector of the NPN transistor and the output of the post-mixer linearizer.

12. A mixer circuit according to claim 11 wherein the current mirror includes:

a first NPN current mirror transistor having an emitter connected to a common supply terminal, a base, and a collector connected to the collector of the PNP transistor of the second output driver;

a second NPN current mirror transistor having an emitter connected to the common supply terminal, a base connected to the base of the first NPN current mirror transistor, and a collector connected to the output of the post-mixer linearizer;

a first current mirror resistor connected between the common supply terminal and the bases of the first and second NPN current mirror transistors;

a PNP current mirror transistor having a collector connected to the common supply terminal, a base connected to the collector of the first NPN current mirror transistor, and an emitter;

a third NPN current mirror transistor having an emitter connected to the bases of the first and second NPN current mirror transistors, a base, and a collector connected to a voltage supply terminal;

a second current mirror resistor connected between the emitter of the PNP current mirror transistor and the base of the third NPN current mirror transistor; and a current mirror current source coupled to the base of the third NPN transistor.

13. A mixer circuit according to claim 12 wherein the current mirror current source includes:

a diode having an anode coupled to the voltage supply terminal and a cathode coupled to the collectors of the first and second branch transistors; and a current source transistor having an emitter coupled to the voltage supply terminal, a base coupled to the cathode of the current mirror current source diode, and a collector coupled to the base of the third NPN current mirror transistor.

14. A mixer circuit, comprising:

a mixer including a first input for receiving a first input signal, a second input for receiving a second input signal, and first and second differential outputs for providing a differential mixed output signal thereacross that is the product of the first signal and the second signal, the mixer having a linear transconductance within a given operating range and a nonlinear transconductance outside the given operating range; and a post-mixer linearizer circuit having a first input coupled to the first differential output of the mixer, a second input coupled to the second differential output of the mixer, and an output for providing an output signal having improved linearity, wherein the post-mixer linearizer includes a first NPN transistor having a base, a collector, and an emitter, the base coupled to the first differential output of the mixer and the collector coupled to the post-mixer linearizer output, a first PNP transistor having a base, a collector, and an emitter, the emitter of the first PNP transistor coupled to the emitter of the first NPN transistor, and means coupled between the inputs of the post-mixer linearizer and the base of the first PNP transistor for decreasing a base voltage on the base of the first PNP transistor responsive to an increase in a voltage at the base of the first NPN transistor so that a nonlinear increase in current is produced in the collector of the first NPN transistor, the nonlinear increase in the collector current counteracting the nonlinear transconductance characteristics of the mixer thereby increasing the linear transconductance of the mixer circuit outside the given operating range.

15. A mixer circuit according to claim 14 further comprising:

a second NPN transistor having a base, a collector, and an emitter, the base coupled to the second differential output of the mixer;

a second PNP transistor having a base, a collector coupled to the post-mixer linearizer output, and an emitter, the emitter of the second PNP transistor coupled to the emitter of the second NPN transistor; and means coupled between the inputs of the post-mixer linearizer and the base of the second PNP transistor for decreasing a base voltage on the base of the second PNP transistor responsive to an increase in a voltage at the base of the second NPN transistor so that a nonlinear increase in current is produced in the collector of the second NPN transistor, the nonlinear increase in the collector current counteracting the nonlinear transconductance characteristics of the mixer thereby increasing the linear transconductance of the mixer circuit outside the given operating range.

16. A mixer circuit according to claim 15 wherein the means for decreasing a base voltage on the base of the first PNP transistor responsive to an increase in a voltage at the base of the first NPN transistor includes:

a first emitter-follower having a base, a collector, and an emitter, the collector coupled to a positive supply rail and the base coupled to the first differential output of the mixer;

a first diode-connected transistor having an anode and a cathode, the anode coupled to the emitter of the first emitter follower and the cathode coupled to the base of the second PNP transistor;

a first current source coupled to the cathode of the first diode-connected transistor;

a second emitter-follower having a base, a collector, and an emitter, the collector coupled to the positive supply rail and the base coupled to the second differential output of the mixer;

a second diode-connected transistor having an anode and a cathode, the anode coupled to the emitter of the second emitter follower and the cathode coupled to the base of the first PNP transistor; and a second current source coupled to the cathode of the first diode-connected transistor.

17. A mixer circuit according to claim 14 including a first resistor interposed between the emitter of the first NPN transistor and emitter of the first PNP transistor.

18. A mixer circuit according to claim 15 including a second resistor interposed between the emitter of the second NPN transistor and emitter of the second PNP transistor.

19. A mixer circuit according to claim 16 wherein the post-mixer linearizer circuit includes:

a first current mirror coupled to the collector of the first NPN transistor and the output of the post-mixer linearizer, the first current mirror providing a first mirrored current to the post-mixer linearizer output that is proportional to the collector current in the first NPN transistor; and a second current mirror coupled to the collector of the second NPN transistor and the output of the post-mixer linearizer, the second current mirror providing a second mirrored current to the post-mixer linearizer output that is proportional to the collector current in the first NPN transistor.

20. A mixer circuit according to claim 19 wherein the first current includes:

an input transistor having a collector coupled to the collector of the first NPN transistor, an emitter coupled to the positive supply rail, and a base;

an output transistor having a base coupled to the base of the input transistor, an emitter coupled to the positive supply rail, and a collector coupled to the output of the post-mixer linearizer;

a drive transistor having an emitter coupled to the base of the output transistor for receiving a drive current, a collector coupled to a common supply rail, and a base; and an offset transistor having a collector coupled to the positive supply rail, an emitter coupled to the base of the drive transistor, and a base coupled to the collector of the input transistor for reducing voltage offset in the current mirror.

21. A mixer circuit according to claim 20 including a resistor interposed between the emitter of the offset transistor and the base of the drive transistor and a capacitor coupled between the base of the drive transistor and the base of the offset transistor for further reducing the voltage offset in the current mirror.

22. A mixer circuit according to claim 14 including an input driver having an input for receiving a single ended local oscillator signal and a differential output coupled to the input first and second inputs of the mixer, the input driver comprising:

a single-end to differential converter having a singled ended input, a mid-point voltage input, and first and second differential outputs;

a first emitter-follower having a base, a collector, and an emitter, the collector coupled to a positive supply rail and the base coupled to the first differential output of the single-end to differential converter;

a first diode-connected transistor having an anode and a cathode, wherein the anode is coupled to the emitter of the first emitter follower;

a first current source coupled to the cathode of the first diode-connected transistor;

a first complementary pair of transistors having a first input coupled to the first differential output of the single-end to differential converter, a second input coupled to the cathode of the first diode-connected transistor, and an output coupled the first input of the mixer;

a second emitter-follower having a base, a collector, and an emitter, the collector coupled to the positive supply rail and the base coupled to the second differential output of the single-end to differential converter;

a second diode-connected transistor having an anode and a cathode, wherein the anode is coupled to the emitter of the second emitter follower; and a second current source coupled to the cathode of the first diode-connected transistor; and a second complementary pair of transistors having a first input coupled to the second differential output of the signal-end to differential converter, a second input coupled to the cathode of the second diode-connected transistor, and an output coupled the second input of the mixer.

23. A mixer circuit according to claim 14 including a linear-in-decibel gain control circuit having an input for receiving a gain control input current and an output coupled to the mixer, the gain control circuit comprising:

a first gain control transistor having a base, a collector coupled to a bias node for receiving a bias current, and an emitter coupled to a common supply rail;

a second gain control transistor having a base coupled to the collector of the first gain control transistor, a collector coupled to a positive supply rail, and an emitter coupled to a gain control input of the mixer;

a first resistor coupled between the base of the first gain control transistor and the gain control circuit input;

a second resistor coupled between the gain control circuit input and the gain control input of the mixer for providing a gain control output signal thereto; and a third resistor coupled between the emitter of the second gain control transistor and the common supply rail, a linear change in the gain control input current producing a corresponding linear change in a voltage across the second resistor that produces an exponential change in a gain of the mixer.

24. A mixer circuit according to claim 23 wherein the linear-in-decibel gain control circuit includes:

a third gain control transistor having a base, a collector, and an emitter, the collector coupled to the positive supply rail and the emitter coupled to the collector of the second gain control transistor;

a gain control diode-connected transistor having an anode coupled to the collector of the third gain control transistor and a cathode coupled to the base of the third gain control transistor so that a current flowing through the diode-connected transistor is supplied to the base of the third gain control transistor; and a gain control mirror transistor having a base coupled to the cathode of the gain control diode-connected transistor, a collector coupled to the anode of the gain control diode-connected transistor, and an emitter coupled to the base of the second gain control transistor to supply a mirror of the current through the diode-connected transistor to the base of the second gain control transistor.

25. A mixer circuit, comprising;

a mixer including a first pair of differential inputs for receiving a first differential input signal, a second pair of differential inputs for receiving a second differential input signal, and a pair of differential outputs for providing a mixed differential output signal; and an input driver having first and second inputs for receiving a differential input signal, a first output coupled to a first one of the first pair of differential inputs of the mixer, and a second output coupled to a second one of the first pair of differential inputs of the mixer, the input driver including:

a first output driver having a first input coupled to the first input of the input driver, a second input, and and output coupled to the first output of the input driver, a second output driver having a first input coupled to the second input of the input driver, a second input, and an output coupled to the second output of the input driver, a first diode having an anode coupled to the first input of the first output driver and a cathode connected to the second input of the second output driver, a first current source connected to the cathode of the first diode, a second diode having an anode coupled to the second input of the input driver and a cathode connected to the second input of the first output driver, and a second current source connected to the cathode of the second diode.

26. A mixer circuit according to claim 25 further comprising a first transistor having a PN junction interposed between the first input of the input driver and the anode of the first diode.

27. A mixer circuit according to claim 26 further comprising a second transistor having a PN junction interposed between the second input of the input driver and the anode of the second diode.

28. A mixer circuit according to claim 27 further including a single-ended to differential converter, the converter having a single-ended input for receiving a single-ended input signal, a reference voltage input for receiving a reference voltage signal, a first differential output coupled to the first input of the input driver, a second differential output coupled to the second input of the input driver, the converter generating a differential version of the single-ended input signal balanced about the reference voltage.

29. A mixer circuit according to claim 25 including a post-mixer linearizer circuit having a differential input coupled to the output of the mixer and having an output, the post-mixer linearizer including:

a first post-mixer output driver having a first input coupled to the first output of the mixer, a second input, and an output coupled to the ouput of the post-mixer linearizer for providing a first half of the linearized mixer output signal, a second post-mixer output driver having a first input coupled to the second output of the mixer, a second input, and an output coupled to the output of the post-mixer linearizer for providing a second half of the linearized mixer output signal, a first post-mixer diode having an anode coupled to the first mixer output and a cathode connected to the second input of the second post-mixer output driver, wherein the first post-mixer diode reduces a signal level at the second input of the second post-mixer output driver responsive to an increase in a signal level at the first mixer output, a first post-mixer current source connected to the cathode of the first post-mixer diode, a second post-mixer diode having an anode coupled to the second mixer output and a cathode connected to the second input of the first post-mixer output driver, wherein the second post-mixer diode reduces a signal level at the second input of the first post-mixer output driver responsive to an increase in a signal level at the second mixer output, whereby the linearized mixer output signal has improved linearity over the output signal of the mixer, and a second post-mixer current source connected to the cathode of the second post-mixerdiode.

30. A method for processing signals with a mixer, comprising;

combining a first signal and second signal together with the mixer to produce a mixed differential signal comprised of a first end and a second end on first and second differential outputs of the mixer, the mixer having a linear response within a given operating range and a nonlinear response outside the given operating range;

providing an output driver including a first transistor and a second transistor, each transistor having a base, a collector, and an emitter, the emitters of the first and second transistors coupled together;

providing the first end of the mixed differential signal to the base of the first transistor;

decreasing a base voltage on the base of the second transistor responsive to an increase in the first end of the mixed differential signal at the base of the first transistor so that a nonlinear increase in current is produced in the collector of the first transistor; and generating a mixer outout signal responsive to the collector current of the first transistor, wherein the nonlinear increase in the collector current counteracts the nonlinear characteristics outside the mixer linear operating range thereby extending the overall linear operating range of the mixer; and coupling the mixer output signal to an output node.

31. A method according to claim 30 including the step of interposing a resistor between the emitter of the first transistor and the emitter of the second transistor so as to change the nonlinear response of the collector current of the first transistor.

32. A method according to claim 30 including the steps of:

providing a second output driver including a third transistor and a fourth transistor, each transistor having a base, a collector, and an emitter, the emitters of the third and fourth transistors coupled together;

providing the second end of the mixed differential signal to the base of the third transistor;

decreasing a base voltage on the base of the fourth transistor responsive to an increase in the second end of the mixed differential signal at the base of the third transistor so that a nonlinear increase in current is produced in the collector of the third transistor;

generating a second mixer output signal responsive to the collector current of the third transistor, wherein the nonlinear increase in the collector current of the third transistor counteracts the nonlinear characteristics outside the mixer linear operating range thereby extending the overall linear operating range of the mixer; and coupling the second mixer output signal to the output node so as to combine the second mixer output signal with the mixer output signal.

33. A method according to claim 32 including the step of interposing a resistor between the emitter of the third transistor and the emitter of the fourth transistor so as to change the nonlinear response of the collector current of the third transistor.

34. A method according to claim 33 wherein the step of generating a mixer output signal responsive to the collector current of the first emitter follower includes the steps of:

mirroring the collector current in the first emitter follower; and providing the mirrored collector current to the output node.

35. A method according to claim 30 including wherein the step of decreasing a base voltage on the base of the second transistor responsive to an increase in the first end of the mixed differential signal at the base of the first transistor so that a nonlinear increase in current is produced in the collector of the first transistor includes the steps of:

coupling a diode between the second differential output of the mixer and the base of the second transistor;

passing a current through the diode; and increasing the current through the diode responsive to an increase in the first end of the differential signal so that an increasing voltage is produced across the diode thereby lowering the base voltage on the base of the second transistor.

36. A method according to claim 32 including wherein the step of decreasing a base voltage on the base of the fourth transistor responsive to an increase in the second end of the mixed differential signal at the base of the third transistor so that a nonlinear increase in current is produced in the collector of the third transistor includes the steps of:

coupling a diode between the second differential output of the mixer and the base of the fourth transistor;

passing a current through the diode; and increasing the current through the diode responsive to an increase in the second end of the differential signal so that an increasing voltage is produced across the diode thereby lowering the base voltage on the base of the fourth transistor.

* * * * *